United States Patent
Ritter

(10) Patent No.: US 9,234,298 B2
(45) Date of Patent: Jan. 12, 2016

(54) METHOD AND APPARATUS FOR REDUCING IMPURITIES IN A SINGLE CRYSTAL BASED ON INGOT LENGTH

(71) Applicant: Siemens Medical Solutions USA, Inc., Malvern, PA (US)

(72) Inventor: Keith Ritter, Addison, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 617 days.

(21) Appl. No.: 13/650,194

(22) Filed: Oct. 12, 2012

(65) Prior Publication Data

US 2014/0102357 A1    Apr. 17, 2014

(51) Int. Cl.
| | |
|---|---|
| C30B 35/00 | (2006.01) |
| C30B 29/12 | (2006.01) |
| C30B 15/20 | (2006.01) |
| C30B 15/14 | (2006.01) |

(52) U.S. Cl.
CPC .................. *C30B 29/12* (2013.01); *C30B 15/14* (2013.01); *C30B 15/20* (2013.01); *C30B 35/00* (2013.01); *Y10T 117/1004* (2015.01); *Y10T 117/1072* (2015.01)

(58) Field of Classification Search
CPC ........ C30B 15/20; C30B 35/00; C30B 15/14; C30B 29/12; Y10T 117/1004; Y10T 117/1072
USPC ...................... 117/14, 15, 201, 202
See application file for complete search history.

(56) References Cited

U.S. PATENT DOCUMENTS

| 3,761,692 A * | 9/1973 | Cope ............................. 117/202 |
| 2003/0051658 A1* | 3/2003 | Nakagawa et al. ............. 117/13 |
| 2006/0174819 A1* | 8/2006 | Mitamura et al. .............. 117/13 |
| 2010/0224786 A1* | 9/2010 | Gullickson .............. 250/370.03 |

* cited by examiner

*Primary Examiner* — Matthew Song
(74) *Attorney, Agent, or Firm* — Peter Kendall

(57) ABSTRACT

A method for growing a single crystal in a chamber. The method includes heating raw material to form a melt for forming the single crystal. A crystal seed is then inserted into the melt and pulled from the melt to form a partial ingot, wherein the partial ingot radiates heat. An amount of gas is then introduced into the chamber which corresponds to a size of the partial ingot so as to provide a constant crystallization rate.

13 Claims, 2 Drawing Sheets

METHOD AND APPARATUS FOR REDUCING IMPURITIES IN A SINGLE CRYSTAL BASED ON INGOT LENGTH

FIELD OF THE INVENTION

This invention relates to growing a single crystal from a melt, and more particularly, to a method and apparatus for reducing impurities in the single crystal based on an ingot length.

BACKGROUND OF THE INVENTION

Single crystals are used in a variety of applications, in particular as scintillation materials in nuclear imaging applications such as positron emission tomography (PET) and Single Photon Emission Computed Tomography (SPECT). Materials used to form single crystals for such applications include sodium chloride, potassium chloride, potassium bromide, lithium fluoride, sodium iodide, cesium iodide and others. Single crystals are also used in semiconductor applications. In such applications, the single crystals are produced from materials such as germanium, silicon, solid solutions of tin, lead tellurides and others.

In order to form a single crystal, a starting material such as sodium iodide, sodium chloride or other suitable material is heated in a crucible to produce a melt. The crucible is positioned in a vacuum chamber having water cooled walls. A rotating vertical rod having a crystal seed on a lower end is then lowered into the chamber until the crystal seed comes into contact with the melt material. The crystal seed is then slowly pulled out of the melt as the rod rotates to thus gradually extract a single crystal from the melt to ultimately form a cylindrical ingot.

The crystallization rate of the melt is dependent on several factors including environmental factors such as a temperature gradient and vacuum level within the chamber. It is desirable that the crystallization rate of the melt be substantially constant in order to avoid the formation of impurities in the single crystal. As the crystal seed is pulled, a partial ingot is formed which is raised above the crucible and extends out of the hot melt. Heat is then radiated from the partial ingot under vacuum conditions toward the cooling walls. This causes rapid cooling of areas of the partial ingot resulting in an undesirable sudden change in the crystallization rate, thus creating conditions which promote the generation of impurities in the single crystal.

SUMMARY OF THE INVENTION

A method for growing a single crystal in a chamber. The method includes heating raw material to form a melt for forming the single crystal. A crystal seed is then inserted into the melt and pulled from the melt to form a partial ingot, wherein the partial ingot radiates heat. An amount of gas is then introduced into the chamber which corresponds to a size of the partial ingot so as to provide a constant crystallization rate.

DESCRIPTION OF THE INVENTION

Figure 1:
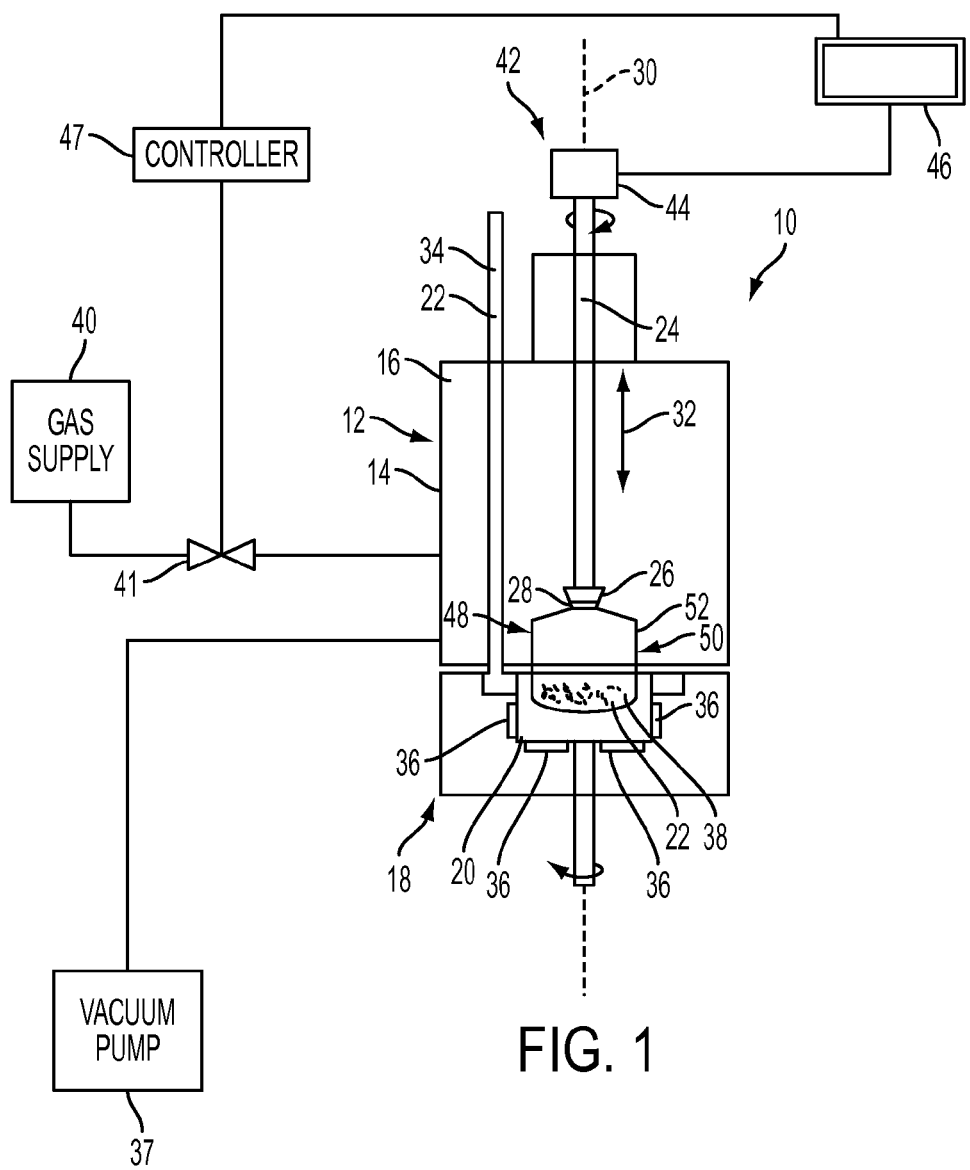
FIG. 1 depicts a crystal growing apparatus in accordance with the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings. In the description below, like reference numerals and labels are used to describe the same, similar or corresponding parts in the several views of FIGS. 1-2.

Referring to FIG. 1, a crystal pulling apparatus 10 is shown. The apparatus 10 includes an upper chamber 12 having walls 14 that form a cavity 16. The walls 14 of the upper chamber 12 may be cooled by water, for example. The apparatus 10 also includes a lower chamber 18 which houses a crucible 20 for holding raw material 22 used to form a single crystal 48. The raw material may be, for example, sodium chloride, potassium chloride, potassium bromide, lithium fluoride, sodium iodide, cesium iodide, germanium, silicon, solid solutions of tin and lead tellurides and others. A vertical rod 24 extends through the upper chamber 12 and includes a holder 26 for holding a crystal seed 28. The crystal seed 28 is used to initiate the formation of the single crystal 48 from the raw material 22 in the crucible 20. The rod 24 and crucible 20 are rotatable about a central axis 30. The rod 24 is also moveable in a vertical direction 32 as it rotates about the central axis 30. A feed tube 34 may be connected to the crucible 20 to enable the supply of raw material 22 to the crucible 20 as needed.

The apparatus 10 is connected to a vacuum pump 36 which serves to evacuate the cavity 16 to a vacuum level suitable for forming single crystals such as approximately zero Torr. Heaters 36 are positioned around sides of the crucible 20 and underneath the crucible 20. The heaters 36 serve to heat the raw material 22 to a suitable temperature for forming a melt 38 used to form a single crystal. In addition, a gas supply 40 is connected to the upper chamber 12. The gas supply 40 is used to introduce a gas, such as argon, into the cavity 16 as will be described. Alternatively, other gases such as helium or nitrogen may be used. The flow of gas into the cavity 16 is regulated by a valve 41 connected between the gas supply 40 and the cavity 16. The apparatus 10 also includes a ingot length measuring device 42 for determining the length of a partial ingot 52 as the crystal seed 28 is pulled from the melt 38. By way of example, the device 42 may include a synchro device 44 for correlating rotation of the rod 24 to the length of the partial ingot 52. In addition, the device 42 includes a display 46 for indicating the length of the ingot. In particular, the synchro device 44 may be of the type sold by INCON in Saco, Me. The apparatus 10 further includes a controller 47 coupled between the valve 41 and the device 42. The controller 47 controls the valve 41 to regulate the amount of gas introduced into the cavity 16 based on the length of the partial ingot 52 determined by the device 42.

In use, the heaters 36 are activated to heat the raw material 22 and form the melt 38. In addition, the rod 24 is rotated about the central axis 30 in order to promote homogeneity in the growth of the single crystal 48. Alternatively, the crucible 20 is rotated or both the rod 24 and crucible 20 are rotated.

Rotating the crucible 20 in a direction opposite to that of the rotation of a growing single crystal further enhances the degree of homogeneity of the melt 38.

The rod 24 is then lowered along the central axis 30 until the crystal seed 28 contacts the melt 38. This causes partial melting of the crystal seed 28 after which an equilibrium is established between the crystal seed 28 and the melt 38 so that there is neither melting nor crystallization of the crystal seed 28. The rod 24 is then slowly raised and the crystal seed 28 is pulled out of the melt 38 as the rod 24 rotates to thus gradually extract the single crystal 48 from the melt 38 to ultimately form a cylindrical ingot. In order to achieve a desired diameter for an ingot, the rate at which the rod 24 is raised is held constant and the temperature of the heaters 36 is simultaneously controlled. During the stage of growing the single crystal 48 to the desired diameter, the rate of raw material 22 provided to the crucible 20 from the feed tube 34 is gradually increased in proportion to the mass rate of growth of the single crystal 48. After the desired diameter of the single crystal 48 is achieved, the feed rate from feed tube 34 is maintained at a constant level so that the diameter of the single crystal 48 remains relatively constant during formation of an ingot. By way of example, a completed ingot may ultimately have a diameter of approximately 440 mm and a length of approximately 30 cm.

It is desirable that the crystallization rate of the melt 38 be substantially constant in order to avoid the formation of impurities in the single crystal 48. As the crystal seed 28 is pulled, a partial ingot 52 is formed that is raised above the crucible 20 and extends out of the hot melt 38 as can be seen in FIG. 1. Heat is then radiated from the partial ingot 52 under vacuum conditions toward the cooled walls 14. This causes rapid cooling of areas of the partial ingot 52 resulting in an undesirable sudden change in the crystallization rate, thus creating conditions which promote the generation of impurities in the single crystal 48. The length of the partial ingot 52 increases as the crystal seed 28 is pulled out of the melt 38 and the partial ingot 52 is grown until a desired length is achieved.

In accordance with the invention, the device 42 determines the length of the partial ingot 52. The length determined by the device 42 is then used by the controller 47 to control the valve 41 so as to introduce an amount of gas into the cavity 16 that is dependent on the length. Thus, gas from gas supply 40 is introduced into the cavity 16 upon formation of the partial ingot 52. The gas serves to facilitate the radiation of heat from the partial ingot 52 to the cooled walls 14 so that cooling of the partial ingot 52 is evenly distributed. The amount of gas introduced into the cavity is dependent on the size of partial ingot 52 as determined by the device 42. Thus, as the partial ingot 52 increases in size as the single crystal 48 is pulled from the melt 38 to ultimately form an ingot, the amount of gas introduced into the cavity 16 is correspondingly increased. This results in a crystallization rate that is substantially constant and hinders the formation of impurities in the single crystal 48. Further, no gas is introduced into the cavity 16 before formation of any portion of an ingot.

Figure 2:
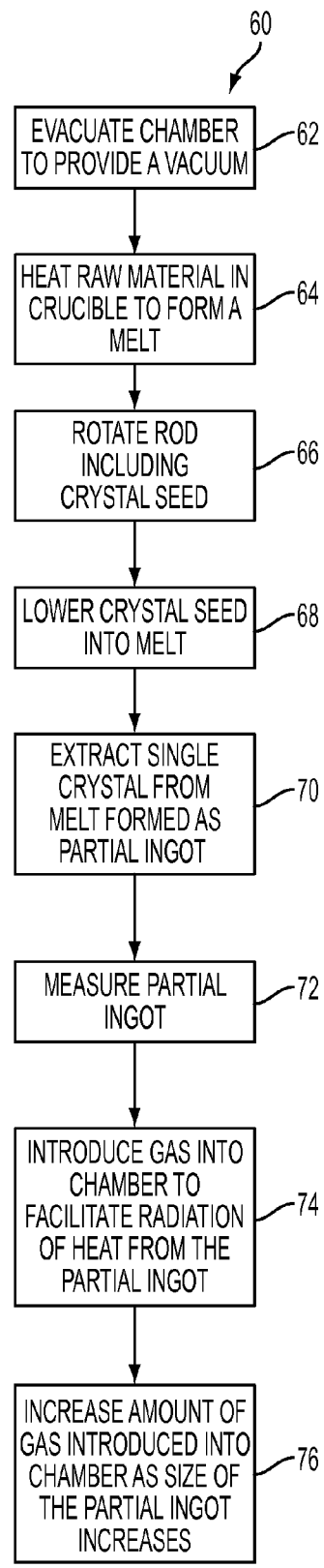
FIG. 2 depicts a method for reducing impurities in the single crystal based on an ingot length

Referring to FIG. 2, a method 60 in accordance with the invention is shown. In step 62, a chamber for forming an ingot is evacuated to a suitable vacuum level. In step 64, a crucible having raw material for forming the ingot is heated to form a melt. In step 66, a rod having a crystal seed is rotated about a central axis. The rod is then lowered until the crystal seed contacts the melt in step 68. The rod is then raised to extract a single crystal from the melt in step 70 formed as a partial ingot that is above the crucible. The partial ingot is measured in step 72. Gas from a gas supply is then introduced into the chamber at a rate sufficient to facilitate the radiation of heat from the partial ingot to the cooled walls so that cooling of the partial ingot is evenly distributed in step 74. In step 76, the rate at which gas is introduced into the chamber is increased in proportion to the rate that the partial ingot increases in size so as to maintain a substantially constant crystallization rate which hinders the formation of impurities in the single crystal.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations.

What is claimed is:

1. A method of growing a single crystal in a chamber, comprising the steps of:
    heating raw material to form a melt for forming the single crystal;
    inserting a crystal seed into the melt;
    pulling the crystal seed from the melt to form a partial ingot, wherein the partial ingot radiates heat; and
    providing an amount of gas into the chamber wherein the gas is provided into the chamber only upon formation of a portion of the partial ingot, wherein the amount of gas corresponds to a size of the partial ingot to provide a constant crystallization rate.

2. The method according to claim 1, further including the step of rotating the crystal seed.

3. The method according to claim 1, wherein the raw material is heated in a rotating crucible.

4. The method according to claim 1, wherein the gas is selected from the group consisting of argon, helium and nitrogen.

5. The method according to claim 1, wherein the raw material is sodium iodide.

6. The method according to claim 1, further including the step of measuring the size of the partial ingot.

7. The method according to claim 6, wherein a synchro is used to measure the size of the partial ingot.

8. A method of growing a single crystal in a chamber, comprising the steps of:
    evacuating the chamber;
    heating raw material to form a melt for forming the single crystal;
    rotating a crystal seed;
    inserting the crystal seed into the melt as the crystal seed rotates;
    pulling the crystal seed from the melt to form a partial ingot, wherein the partial ingot has a first size and radiates heat;
    introducing an amount of gas into the chamber which corresponds to the first size, wherein the gas is introduced into the chamber only upon formation of a portion of the partial ingot;
    increasing the size of the partial ingot; and
    increasing the amount of gas introduced into the chamber as the size of the partial ingot increases.

9. The method according to claim 8, wherein the raw material is heated in a rotating crucible.

10. The method according to claim 8, wherein the gas is selected from the group consisting of argon, helium and nitrogen.

11. The method according to claim 8, wherein the raw material is sodium iodide.

12. The method according to claim 8, further including the step of measuring the size of the partial ingot.

13. The method according to claim 12, wherein a synchro is used to measure the size of the partial ingot.

\* \* \* \* \*